United States Patent
Lu et al.

(10) Patent No.: US 7,361,990 B2
(45) Date of Patent: Apr. 22, 2008

(54) REDUCING CRACKING OF HIGH-LEAD OR LEAD-FREE BUMPS BY MATCHING SIZES OF CONTACT PADS AND BUMP PADS

(75) Inventors: Szu Wei Lu, HsinChu (TW); Hsin-Hui Lee, Kaohsiung (TW); Chung Yu Wang, Taipei (TW); Mirng-Ji Lii, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 355 days.

(21) Appl. No.: 11/082,298

(22) Filed: Mar. 17, 2005

(65) Prior Publication Data

US 2006/0220244 A1    Oct. 5, 2006

(51) Int. Cl.
*H01L 23/48*    (2006.01)
*H01L 21/00*    (2006.01)
*H05K 7/10*    (2006.01)

(52) U.S. Cl. .................. 257/738; 257/772; 257/778; 257/786; 361/767; 361/768; 438/108

(58) Field of Classification Search .............. None
See application file for complete search history.

(56) References Cited

U.S. PATENT DOCUMENTS

| | | | |
|---|---|---|---|
| 6,177,729 B1 * | 1/2001 | Benenati et al. ........... 257/738 |
| 6,583,039 B2 | 6/2003 | Chen et al. |
| 6,586,322 B1 | 7/2003 | Chiu et al. |
| 6,593,220 B1 * | 7/2003 | Yu et al. ..................... 438/612 |
| 6,605,524 B1 | 8/2003 | Fan et al. |
| 6,767,411 B2 * | 7/2004 | Yeh et al. ..................... 148/24 |
| 2006/0131728 A1 * | 6/2006 | Salmon ....................... 257/698 |

OTHER PUBLICATIONS

Mercado, L.L., et al., "Impact of Flip-Chip Packaging on Copper/Low-k Structures," IEEE Transactions on Advanced Packaging, vol. 26, No. 4, Nov. 2003, pp. 433-440.

Jittinorasett, S., "UBM Formation on Single Die/Dice for Flip Chip Applications," Thesis, Virginia Polytechnic Institute and State University, Aug. 25, 1999, 89 pages, http://scholar.lib.vt.edu/theses/available/etd-082699-110209/unrestricted/Final.pdf.

* cited by examiner

*Primary Examiner*—Alonzo Chambliss
(74) *Attorney, Agent, or Firm*—Slater & Matsil, L.L.P.

(57) ABSTRACT

A semiconductor package assembly comprises a first conductive pad on a semiconductor substrate; a second conductive pad on a package substrate; a bump physically coupled between the first conductive pad and the second conductive pad, wherein the bump is substantially lead-free or high-lead-containing; the bump has a first interface with the first conductive pad, the first interface having a first linear dimension; the bump has a second interface with the second conductive pad, the second interface having a second linear dimension; and wherein the ratio of the first linear dimension and the second linear dimension is between about 0.7 and about 1.7.

15 Claims, 3 Drawing Sheets

REDUCING CRACKING OF HIGH-LEAD OR LEAD-FREE BUMPS BY MATCHING SIZES OF CONTACT PADS AND BUMP PADS

TECHNICAL FIELD

This invention relates generally to integrated circuit packaging, more particularly to a method of forming electrically conductive bumps for flip chip packages.

BACKGROUND

A flip chip microelectronic assembly includes a direct electrical connection of facing-down (that is, "flipped") electronic components onto substrates, such as ceramic substrates, circuit boards, or carriers using conductive bump bond pads of the chip. Flip chip technology is quickly replacing older wire bonding technology that uses facing-up chips with a wire connected to each pad on the chip.

The flip chip components used in flip chip microelectronic assemblies are predominantly semiconductor devices, however, components such as passive filters, detector arrays, and memory devices are also being used in flip chip form. Flip chips are advantageous because of their high-speed electrical performance when compared to other assembly methods. Eliminating bond wires reduces the delay in inductance and capacitance of the connection, and substantially shortens the current path, resulting in a high-speed off-chip interconnection.

Flip chips also provide the most rugged mechanical interconnection. When underfilled with an adhesive such as an epoxy, flip chips can withstand the most rugged durability testing. Additionally, flip chips can be the lowest cost interconnection for high-volume automated production.

Flip chips are typically made by placing solder bumps on a silicon chip, and the solder bump flip chip process typically includes four sequential steps: 1) preparing the chip for solder bumping; 2) forming or placing the solder bumps on the chip; 3) attaching the solder bumped chip to a board, substrate or carrier; and 4) completing the assembly with an adhesive underfill. The bumps of the flip chip assembly serve several functions. The bumps provide electrical conductive paths from the chip (or die) to the substrate on which the chip is mounted. A thermally conductive path is also provided by the bumps to carry heat from the chip to the substrate. The bumps also provide part of the mechanical mounting of the chip to the substrate. Finally, the bumps act as a short lead to relieve mechanical strain between the chip and the substrate.

Eutectic solder material containing lead (Pb) and tin (Sn) is typically used for solder bumps. A commonly used lead containing eutectic solder has about 63% tin (Sb) and 37% lead (Pb). This combination gives the solder material suitable melting point and low electrical resistivity.

Lead is a toxic material. Legislation and industry requirements have demanded lead-free solder bumps. Companies in the supply chain of the electronics interconnection industry are actively seeking to replace Sn—Pb solder. However, the commonly known lead-free solder, such as Sn—Ag, Sn—Ag—Cu and their inter-metallic components are too brittle, therefore, suffering cracking. On the other hand, high-lead bumps are also preferred by the industry for applying in high electro-migration performance. Addition of lead provides increased corrosion resistance, lowers the reflow temperature of pure tin, and lowers the surface tension of pure tin. High-lead bumps are also brittle and each prone to cracking.

Bump cracking is typically generated by stress. The coefficient of thermal expansion (CTE) mismatch between materials in the package assembly is one of the main reasons causing stress. For example, silicon substrate typically has a CTE of higher than about 3 ppm/C, low-k dielectric has a CTE of higher than about 20 ppm/C, while the package substrate has a CTE of higher than about 17 ppm/C. The significant difference of CTEs introduces stress to the structure when thermal change occurs. One solution to this problem is through the underfill process in which a liquid epoxy is dispensed along one or two sides of a chip to fill the gap between the chip and a substrate. Epoxy underfill helps spread the stress and protect the solder bumps.

With low-k dielectrics widely used in the integrated circuit, a dilemma exists between the protection of bumps and low-k dielectrics. The protection of brittle bumps demands high strength underfills. However, the low-k dielectrics may be harmed by high strength underfill material and problems such as delaminating occur.

Therefore, with low-k dielectrics used, both lead-free and high-lead bumps need to be protected, preferably without using high strength underfill. Conventional solutions for the bump cracking problem have been concentrated on materials. Exploring a solution from a view of the structure therefore becomes valuable. The preferred embodiment of the present invention provides a solution with a modified structure.

SUMMARY OF THE INVENTION

In accordance with one aspect of the present invention, a semiconductor package assembly comprises a contact pad (first conductive pad) or an under bump metallurgy (UBM) on a semiconductor substrate, a bump underlying the contact pad and overlying a package substrate, which has a bump pad (second conductive pad) in contact with the bump. A top interface exists between the contact pad/UBM and the bump, and a bottom interface exists between the bump and a bump pad of the package substrate. The sizes of the top and bottom interfaces are substantially comparable. The balanced structure reduces stress applied to the bump, the inter-metallic component and neighboring materials. The reliability of the resulting assembly is significantly improved.

The preferred embodiment of the present invention has presented a packaging solution that solves the cracking problem for lead-free and high-lead-containing bumps. The solution is compatible with the present packaging process. There is no extra effort or cost introduced. Also there is no requirement of using high strength underfills to protect bumps, therefore, damage to low-k materials in the chip is avoided.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The preferred embodiment of the present invention presents a package assembly structure that uses lead-free or high-lead-containing bumps. The preferred embodiments are illustrated in FIGS. 1 through 4 wherein like reference numbers are used to designate like elements throughout the various views and illustrative embodiments of the present invention.

Figure 1:
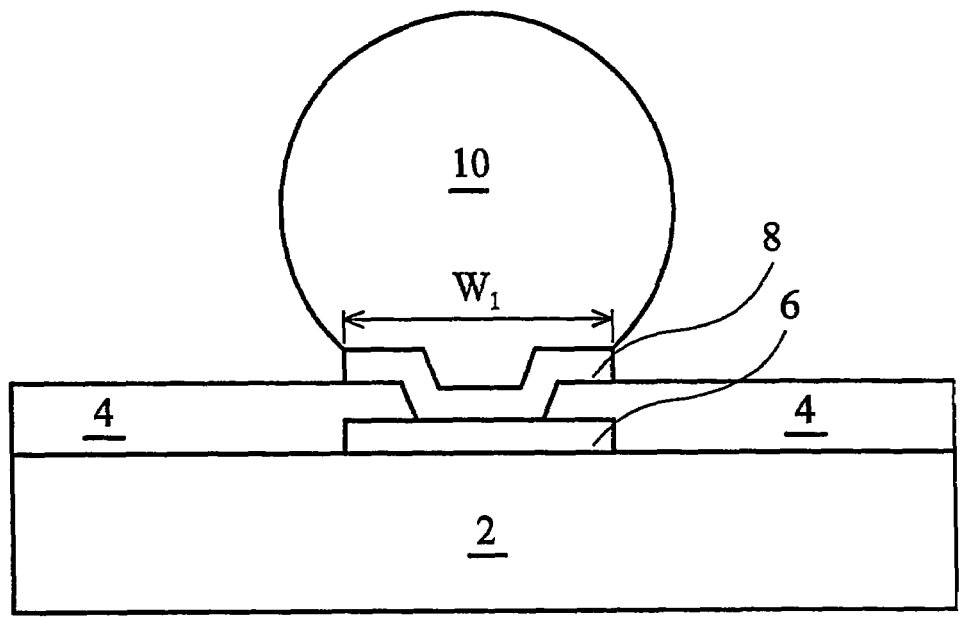
FIG. 1 illustrates a chip having a solder bump.

In the preferred embodiment, solder bumps are formed on chips, which contain integrated circuits. In other embodiments, the solder bumps are formed on package substrates. FIG. 1 illustrates a semiconductor substrate 2 having a solder bump 10 formed on a conductive pad, which is typically referred to as an under bump metallurgy (UBM) 8. The semiconductor substrate 2 is sometimes referred to as chip 2. The semiconductor substrate 2 preferably comprises low-k dielectrics that typically have low strength. Preferably, at least one low-k dielectric layer having a k value of less than about 3.3 is included in the semiconductor substrate 2. A passivation layer 4, which is preferably formed of dielectric materials such as nitride, oxide, polyimide, and the like, is formed on the surface of chip 2. A contact pad 6 is electrically coupled to the integrated circuit (not shown) in the semiconductor substrate 2 and is preferably formed of copper, aluminum, or alloys thereof and the like. An under bump metallurgy (UBM) 8, also referred to as under bump metallization layer, which is a conductive pad, is preferably formed on the contact pad 6. UBM 8 provides good adhesion between the contact pad 6 and the bump 10. It typically has a composite structure comprising multiple layers and serves as a diffusion barrier, a solder wettable layer, and an oxidation barrier. UBM 8 can be formed by sputtering, evaporation, electro plating or alternative methods. The multiple layers of UBM 8 are deposited sequentially, and the wettable layer, which is the outmost layer of UBM 8, is typically formed of a conductive material comprising copper, nickel, palladium, or alloys thereof. UBM 8 preferably has the shape of a square or a rectangle having substantially equal length and width. The longest distance that can be found between any two points, also referred to as the linear dimension $W_1$ of UBM 8, is preferably between about 30 µm and about 200 µm, more preferably about 100 µm. When linear dimension is used, it indicates that the shapes of bump pads or UBMs are not limited to a square and a rectangle, and can be an arbitrary shape. A linear dimension is the diameter of a circle. A chip typically comprises multiple contact pads and multiple bumps. The pitch, or the distance between bumps 8, is preferably between about 100 µm and 300 µm, more preferably about 150 µm and 250 µm.

After UBM 8 deposition, a solder bump 10 is formed on the UBM 8. Solder bump 10 can be formed by commonly used methods such as evaporation, electroplating, printing, solder transfer, ball placement, etc. In one preferred embodiment, a lead-free bump 10 comprises tin, silver, and, optionally, copper. In an exemplary embodiment, the lead-free bump 10 comprises about 95% to about 97% tin, about 3% to about 4% silver, and about 0.5% to about 1.5% copper. A high-lead bump preferably comprises between about 95% to about 97% lead, about 3% and about 5% tin, more preferably about 95% lead and 5% tin.

Figure 2:
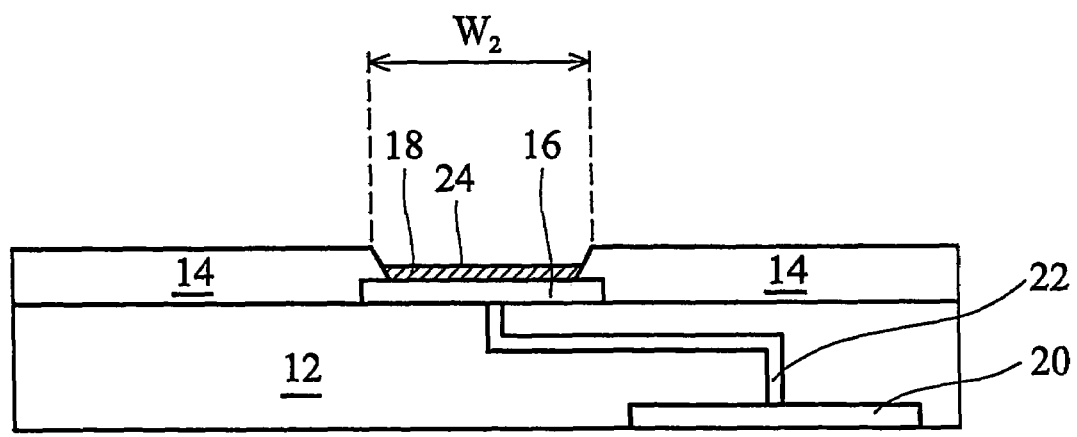
FIG. 2 illustrates a package substrate.

FIG. 2 illustrates a package substrate 12. The package substrate 12 is preferably formed of a material such as polymer, ceramic, and print circuit. Bump pad 16 preferably comprises copper, aluminum, and alloys thereof. A solder resistance layer 14 is formed on package substrate 12 preventing solder from adhering to undesired parts of the package substrate 12. A solder resistance opening (SRO) 24 exposing bump pad 16 is formed through the solder resistance layer 14. SRO 24 is preferably a square or a rectangle having substantially equal length and width. The longest length, or the linear dimension $W_2$ of the SRO 24, is preferably between about 30 µm and about 200 µm, more preferably about 100 µm. A protecting layer 18, which is a conductive pad, is optionally formed on the bump pad 16. The protecting layer 18 preferably has a thickness of between about 100 Å to about 10,000 Å and is formed of a conductive material such as nickel, gold, or alloys thereof. Conductive line 22 electrically couples the bump pad 16 and another bump pad 20. The function of the bump pad 20 will be discussed in subsequent paragraphs.

Figure 3:
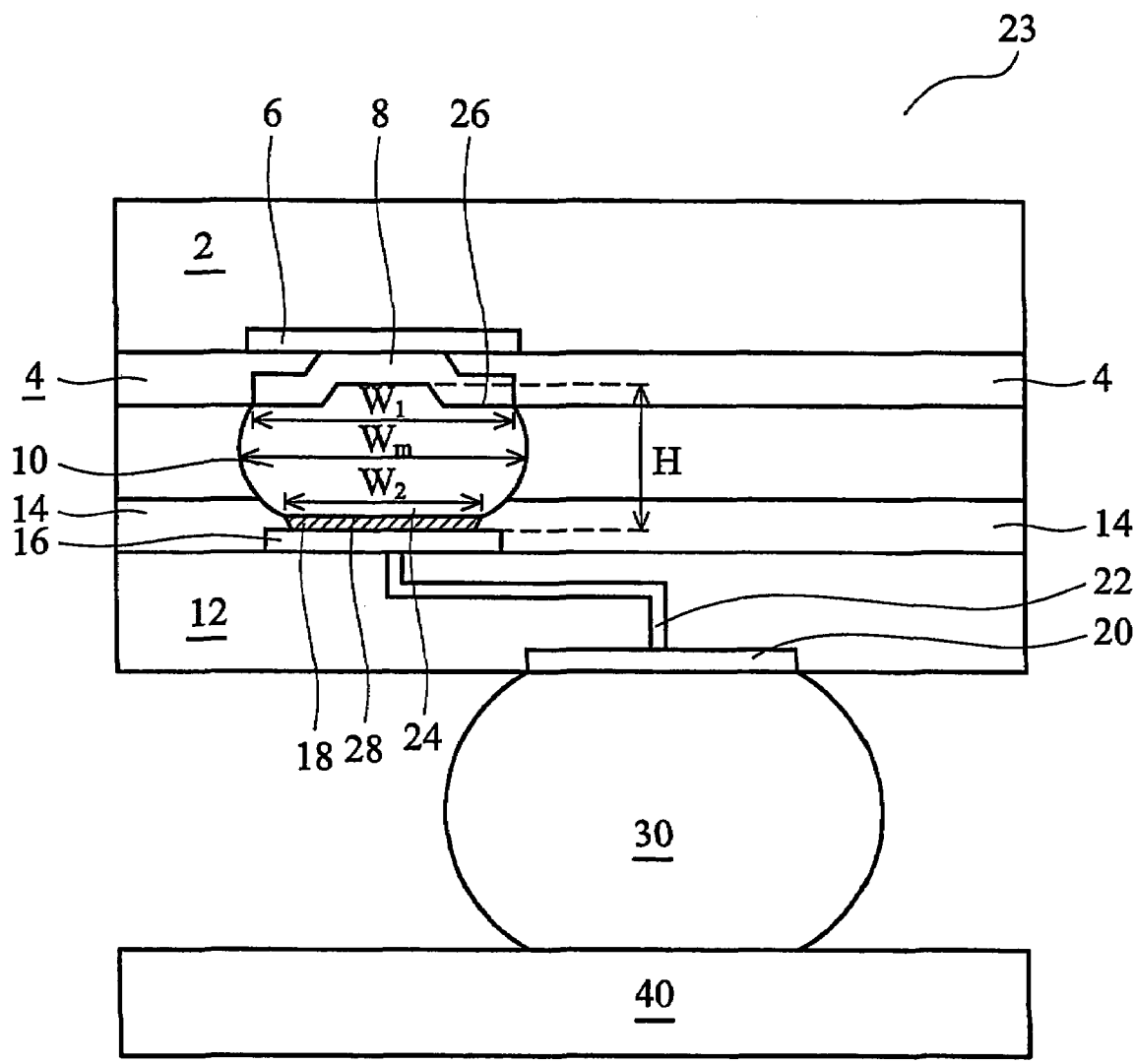
FIGS. 3 and 4 illustrate package assemblies with a chip and a package substrate integrated.

Semiconductor substrate 2 as referred to in FIG. 1 and package substrate 12 as referred to in FIG. 2 are integrated to form a semiconductor package assembly 23, as illustrated in FIG. 3. Semiconductor substrate 2 is assembled facing down. Flux is applied either on the semiconductor substrate 2 or on the package substrate 12 prior to placing them together. Solder bumps 10 reflow to form a bond between two conductive pads 8 and 16. In the preferred embodiment, the conductive pads 8 and 16 are UBM 8 and bump pad 16, respectively (perhaps through another conductive pad, which is referred to as the protecting layer 18).

After reflowing, bump 10 is re-shaped, it is preferred that the linear dimension $W_m$ of the bump is between about 100 µm and about 300 µm. The ratio of the height H to the greatest width $W_m$ is preferably between about 0.5 and about 1.0. The size of the top interface 26, which is the interface between bump 10 and UBM 8, is typically defined by the size of UBM 8. The size of the bottom interface 28, which is the interface between bump 10 and protecting layer 18, is typically defined by the size of SRO 24. A bump is considered unbalanced if the size of top interface 26 and bottom interface 28 are substantially different. Unbalanced bump 10 has a high stress at the end with smaller size (either the top interface 26 or the bottom interface 28), causing it to be more prone to cracking. Therefore, it is preferred that UBM 8 is balanced, which means the size $W_1$ of UBM 8 is substantially close to the size $W_2$ of SRO 24. Preferably the ratio of $W_1/W_2$ is between about 0.7 and about 1.7, more preferably between about 0.8 and about 1.5, even more preferably between about 0.9 and about 1.3. After bumps reflow, inter-metallic components (IMC) (not shown) are formed at interfaces 26 and 28.

Figure 4:
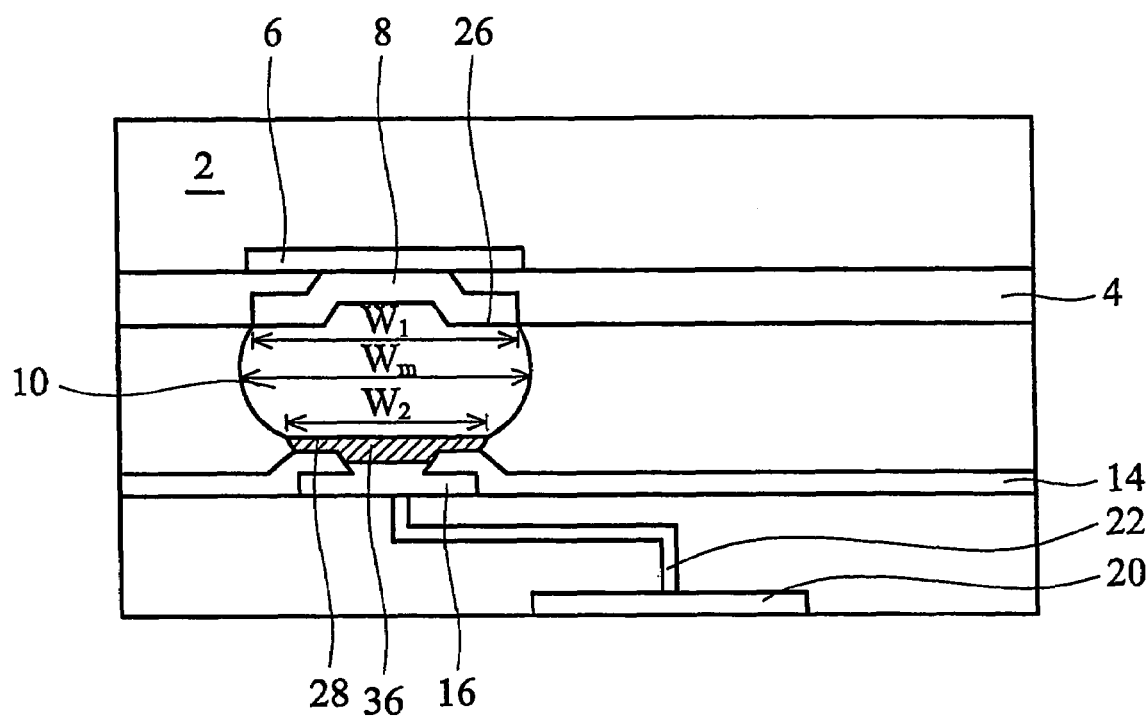

For a high-lead bump assembly to be formed using an organic substrate, a pre-solder layer is preferably formed. FIG. 4 illustrates another preferred embodiment wherein a pre-solder layer 36 is formed between the bump 10 and the bump pad 16. The pre-solder layer 36 is preferably formed of eutectic materials such as an alloy comprising 63% tin and 37% lead, and the like. The bottom interface size of the bump 10 is, therefore, typically defined by the size of the pre-solder layer 36. Similar to the previously discussed embodiment, the linear dimension $W_2$ of the pre-solder layer 36 is preferably between about 30 µm and about 200 µm, more preferably about 100 µm. In order to balance the bump and, thus, reduce stress at the top interface 26 or bottom interface 28, the ratio of $W_1/W_2$ is preferably between about 0.7 and about 1.7, more preferably between about 0.8 and about 1.5, even more preferably between about 0.9 and about 1.3.

Referring back to FIG. 3, the package substrate 12 typically has a layered structure. Through a metal line 22, which is routed in package substrate 12, bump 10 is electrically connected to one of the ball grid array (BGA) balls 30. BGA balls 30 are formed under package substrate 12 and used for electrically coupling the integrated circuit (not shown) on substrate 2 to an external component such as a print circuit board 40. In the preferred embodiment, BGA balls 30 are substantially lead-free and comprise a solder material having a lead concentration of less than about 5%. In alternative embodiments, BGA balls 30 comprise a eutectic alloy comprising lead and tin.

Low-k materials are widely used in integrated circuits as inter-metal dielectrics. Low-k dielectrics typically have lower strength and are sometimes porous, and therefore they are easier to be damaged or delaminated, especially when used together with high strength materials. The use of low-k dielectrics in chip 2 limits the usage of high strength underfill material, which in turn limits the protection bump 10 receives from the underfill. Without the protection, lead-free and high-lead bumps and their IMCs are more prone to cracking. Tests have been conducted regarding the reliability of lead-free and high-lead materials. It has been found that a significant number of samples failed during thermal cycle tests if the bumps are unbalanced. Cracks are typically formed close to the end having smaller interface size. If inappropriate underfill materials are used, failures may also occur due to low-k dielectric de-lamination or underfill de-lamination. When tests are performed on samples with substantially balanced bumps, significant improvements are found. None of the samples failed during the thermal cycle test.

The preferred embodiment of the present invention has presented a packaging solution that solves the cracking problem for lead-free and high-lead bumps. Contrary to prior teachings that the lead-free and high-lead bumps are prone to cracking, the results have demonstrated that lead-free and high lead bumps are not prone to cracking, providing the size balancing requirements specified in the preferred embodiments of the present invention are met. The current solution is fully inline with the existing packaging process and no extra effort or cost is introduced. High strength underfill material is not required for protecting bumps so that damage to low-k dielectrics is avoided.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor package assembly comprising:
   a first conductive pad on a semiconductor substrate;
   a second conductive pad on a package substrate;
   a substantially lead-free bump physically coupled between the first conductive pad and the second conductive pad;
   wherein the bump has a first interface with the first conductive pad, the first interface having a first linear dimension;
   wherein the bump has a second interface with the second conductive pad, the second interface having a second linear dimension, and wherein the first and the second linear dimensions are between about 30 μm and 200 μm, respectively; and
   wherein the first linear dimension and the second linear dimension has a ratio of between about 0.7 and about 1.7.

2. The semiconductor package assembly of claim 1 wherein the semiconductor substrate comprises at least one low-k dielectric layer having a k value of less than about 3.3.

3. The semiconductor package assembly of claim 1 wherein the bump comprises less than about 5 percent lead.

4. The semiconductor package assembly of claim 1 wherein the ratio of the first linear dimension and the second linear dimension is between about 0.8 and about 1.5.

5. The semiconductor package assembly of claim 4 wherein the ratio of the first linear dimension and the second linear dimension is between about 0.9 and about 1.3.

6. The semiconductor package assembly of claim 1 wherein the second conductive pad comprises a material selected from the group consisting essentially of copper, aluminum, and combinations thereof.

7. The semiconductor package assembly of claim 1 wherein the second conductive pad is a protecting layer comprising a material selected from the group consisting essentially of nickel, gold and combinations thereof.

8. The semiconductor package assembly of claim 1 further comprising a plurality of bumps between the semiconductor substrate and the package substrate wherein the bumps have a pitch of between about 100 μm and about 300 μm.

9. The semiconductor package assembly of claim 1 wherein the bump has a height of between about 30 μm and about 200 μm, wherein the height and the first linear dimension has a ratio of between about 0.5 and about 1.0, and wherein the height and the second linear dimension has a ratio of between about 0.5 and about 1.0.

10. The semiconductor package assembly of claim 1 wherein the first conductive pad is an under bump metallization (UBM).

11. The semiconductor package assembly of claim 1 further comprising a plurality of ball grid array (BGA) balls on a surface of the package substrate, wherein the BGA balls comprise a material selected from the group consisting essentially of an eutectic alloy and a material with lead concentration of less than about 5 percent.

12. A semiconductor package assembly comprising:
   a first conductive pad on a semiconductor substrate;
   a second conductive pad on a package substrate;
   a substantially lead-free bump physically coupled between the first conductive pad and the second conductive pad, wherein the bump has a height of between about 30 μm and about 200 μm;

wherein the bump has a first interface with the first conductive pad, the first interface having a first linear dimension;
wherein the bump has a second interface with the second conductive pad, the second interface having a second linear dimension, and wherein ratios of the height to the first and the second linear dimensions are between about 0.5 and about 1.0; and
wherein the first linear dimension and the second linear dimension has a ratio of between about 0.7 and about 1.7.

13. The semiconductor package assembly of claim 12 wherein the bump comprises less than about 5 percent lead.

14. The semiconductor package assembly of claim 12 wherein the ratio of the first linear dimension and the second linear dimension is between about 0.8 and about 1.5.

15. The semiconductor package assembly of claim 12 wherein the ratio of the first linear dimension and the second linear dimension is between about 0.9 and about 1.3.

* * * * *